(12) United States Patent
Estevez

(10) Patent No.: US 8,384,012 B2
(45) Date of Patent: Feb. 26, 2013

(54) PHOTODIODE COMPRISING POLARIZER

(75) Inventor: Jaime Estevez, Munich (DE)

(73) Assignee: Infineon Technologies AG, Neubiberg (DE)

( * ) Notice: Subject to any disclaimer, the term of this patent is extended or adjusted under 35 U.S.C. 154(b) by 642 days.

(21) Appl. No.: 12/463,764

(22) Filed: May 11, 2009

(65) Prior Publication Data
US 2010/0282952 A1    Nov. 11, 2010

(51) Int. Cl.
*G02F 1/01*     (2006.01)
(52) U.S. Cl. ......... 250/225; 257/448; 359/484; 359/485
(58) Field of Classification Search .................. 250/225; 257/448; 359/485.01, 485
See application file for complete search history.

(56) References Cited

U.S. PATENT DOCUMENTS

| | | | | |
|---|---|---|---|---|
| 4,049,944 | A * | 9/1977 | Garvin et al. | 219/121.2 |
| 6,121,667 | A * | 9/2000 | Lee | 257/448 |
| 6,504,153 | B1 * | 1/2003 | Shigenaka et al. | 250/338.4 |
| 7,874,666 | B2 * | 1/2011 | Xu et al. | 351/44 |
| 2002/0185589 | A1 * | 12/2002 | Cazaux | 250/214.1 |
| 2005/0248830 | A1 * | 11/2005 | Sawin et al. | 359/321 |
| 2007/0176617 | A1 * | 8/2007 | Kuwana et al. | 324/760 |
| 2009/0134486 | A1 * | 5/2009 | Fujikata | 257/449 |

* cited by examiner

*Primary Examiner* — Georgia Y Epps
*Assistant Examiner* — Kevin Wyatt
(74) *Attorney, Agent, or Firm* — Slater & Matsil, L.L.P.

(57) ABSTRACT

A photodiode includes a photosensitive area and a polarizing grating located in front of the photosensitive area. The polarizing grating is formed by a plurality of galvanically conducting filaments.

14 Claims, 1 Drawing Sheet

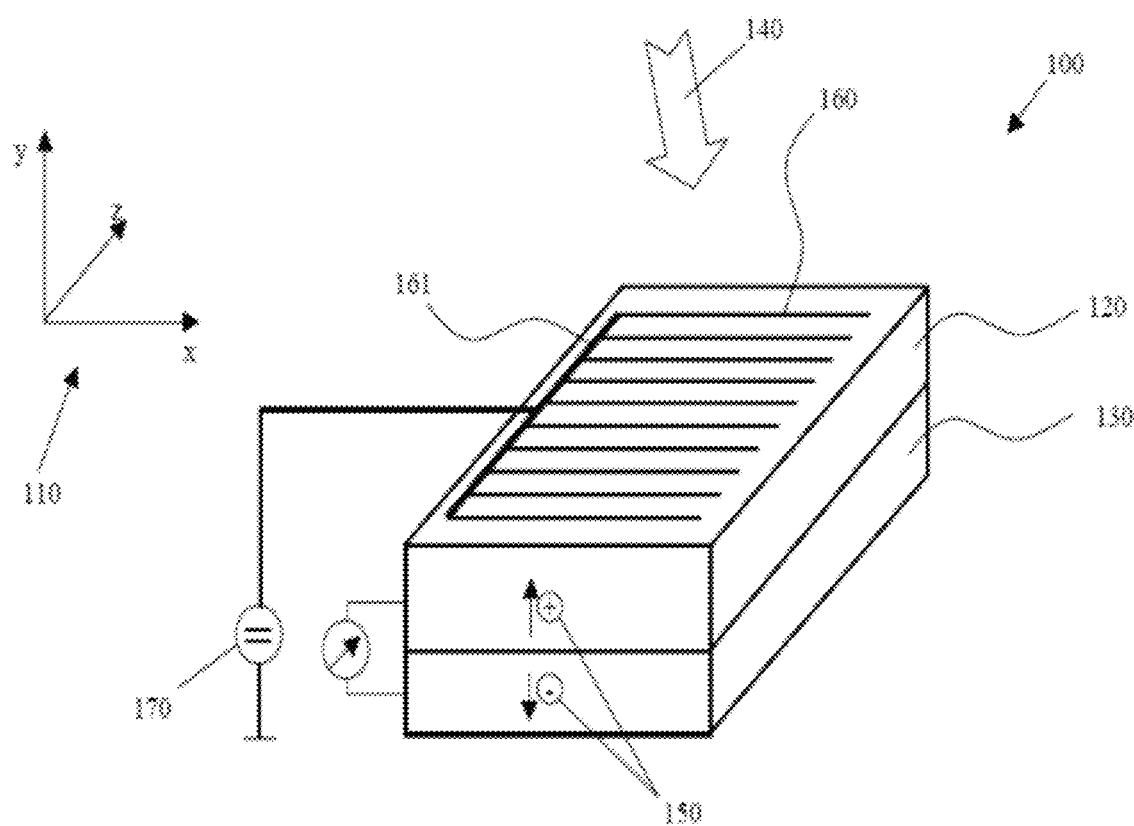

PHOTODIODE COMPRISING POLARIZER

TECHNICAL FIELD

The invention generally relates to photodiodes and, in particular embodiments, to a photodiode comprising a polarizing grating in front of the photosensitive area of the photodiode.

BACKGROUND

Conventional photodiodes transform light into an electric current or voltage at a pn-junction or pin-junction. Depending on the specific pn-junction, the light, which more generally can be considered as an electromagnetic wave, may be of ultraviolet or infrared or visible frequency spectrum. For transforming light of different wavelength a photodiode may comprise silicon for detecting visible light in the range of up to 1 μm or may comprise germanium for detecting light in the infrared spectrum for up to 1.8 μm or other conventional semiconducting materials for transforming light into current or voltage.

When the photosensitive pn-junction is exposed to light, the incident photons generate pairs comprising a mobile electron and a corresponding positively charged hole, thus producing a current flow, as the charge carriers move into the zones of opposite doping due to the diffusion voltage. For affecting a pair of an electron and a hole, the photons necessarily must yield an energy exceeding the band gap of the particular photosensitive pn-junction. The current affected by the impinging photons to a large extent is proportional to the amount of energy comprised in the photons until saturation is encountered.

Photodiodes can be used in a variety of circuits, wherein the photodiodes exhibit different properties. In one embodiment, when the photodiode is operated without any bias, the current flow out of the diode is limited and a voltage builds up, the diode thus becoming forward biased. This causes a so-called dark-current flowing in an opposite direction to the photo current and which in the end causes the photovoltaic effect in solar cells. In another embodiment, the so-called photoconductive mode, a reverse bias may be applied, which decreases the capacitance of the pn-junction and reduces the response time of the diode. In still another embodiment a comparatively high reverse bias may be applied to the diode, which affects a multiplication of each charge carrier by the avalanche effect, thus affecting an internal gain in the photodiode.

Photodiodes are used in a variety of applications, for example, in consumer electronics or any other application wherein light must be detected. In some particular applications polarizers have been used for preventing light of a dedicated polarization to pass through the polarizer and to affect a corresponding current or voltage in the photodiode. In one embodiment, polarizers have been used in combination with photodiodes to differentiate between lights of differing polarization.

The polarizers used in these conventional photodiodes are discrete polarizers. That is, the polarizers are made of glass or transparent plastics in a standalone production process, which is separate from the production process of producing a semiconductor. In other words, the process is separate from producing a photodiode as a conventional semiconductor using conventional semiconductor production methods. When the polarizers were produced they were placed in front of the photosensitive material of the photodiode. The production of these photodiodes accordingly comprises the production of the polarizer and a photo diode, both as separate items, and as a micromechanical assembly of the polarizer in front of the photosensitive area of the diode. As micromechanical assemblies are costly and prone to errors, there is a need for an alternative.

SUMMARY

According to one aspect, a photodiode includes a photosensitive area and a polarizing grating located in front of the photosensitive area. The polarizing grating is formed by a plurality of galvanically conducting filaments.

BRIEF DESCRIPTION OF THE DRAWINGS

The accompanying drawing is included to provide a further understanding of the present invention and is incorporated in and constitutes a part of this specification. The drawing illustrates embodiments of the present invention and, together with the description, serve to explain the principles of the invention. Other embodiments of the present invention and many of the intended advantages of the present invention will be readily appreciated, as they become better understood by reference to the following detailed description.

The sole FIGURE depicts a schematic representation of a photodiode comprising a polarizing grating according to an embodiment of the invention.

DETAILED DESCRIPTION OF ILLUSTRATIVE EMBODIMENTS

In the following detailed description, reference is made to the accompanying drawing, which forms a part hereof, and in which is shown by way of illustration specific embodiments in which the invention may be practiced. It is to be understood that other embodiments may be utilized and structural or other changes may be made without departing from the scope of the present invention.

The sole FIGURE depicts a schematic illustration of a photodiode 100 comprising a polarizing grating according to an embodiment of the invention. Cartesian coordinate system 110 is used in the following for describing the photodiode, wherein the directions of x and y are parallel to the paper plane and the direction of z is perpendicular to the paper plane of the drawing and is directed away from the observer of the FIGURE.

In one embodiment, photodiode 100 comprises a layer of a first semiconducting material 120 adjoining a layer of a second semiconducting material 130, wherein the layers form a pn-junction. First material layer 120 may be a p+ doped semiconductor of a translucent semiconductor material, wherein translucent shall describe the property that semiconductor 120 is diaphanous for light of the specific wavelength according to the desired characteristics of the diode. In an alternative embodiment layer 120 essentially may not be of translucent material, but wherein the layer thickness is small and in this way allows light to penetrate the pn-junction.

Light impinging the surface of the diode as indicated by arrow 140 may accordingly pass layer 120 and then impinge the pn-junction to cause the appearance of pairs of charge carriers 150, which in turn cause a current flow as indicated by the gauge. In this way light, i.e., photons, impinging on the photosensitive area of the photodiode causes a current flow.

In the photodiode, a pair of charge carriers is produced if a photon of sufficient energy hits the semiconductor material, wherein the photon may be of any polarization direction. The photosensitive area of the photodiode accordingly can be characterized as the area where an impinging photon affects a pair of charge carriers contributing to the current.

Photodiode 100 comprises a polarizing grating 160 located in front of the photosensitive area, wherein the polarizing grating is formed by a plurality of galvanically conducting filaments. Light 140 accordingly must pass grating 160 before the photons produce a pair of charge carriers.

The parallel filaments of grating 160 are directed perpendicular to the traveling direction of light 140. In the depicted embodiment the filaments of grating 160 are directed in the direction of the x-axis as indicated by coordinate system 110. Considering that light 140 travels in the direction y, i.e., particularly in the direction opposite as indicated by direction y, grating 160 is located in front of the photosensitive area of the photodiode. Accordingly the light is forced to pass grating 160 before it may produce a pair of charge carriers in the photodiode.

Since the filaments of the grating are of a conducting material, light polarized in the direction of the filaments, i.e., in the direction of the x-axis, affects an oscillation of the electrons in the filaments, the oscillating electrons thus reflecting the electromagnetic wave of light in the direction of the filaments. The grating in this way prevents light polarized in the direction of the filaments to pass the grating. Hence, only light polarized in the direction of the z-axis may pass the grating and may hit the photosensitive area of the photodiode. Consequently only light polarized perpendicular to the grating will pass the grating and will cause pairs of charge carriers and a resulting current or voltage in the diode.

In one embodiment, photodiode 100 accordingly can be used to selectively detect light polarized in a z-direction. Any light 140, which does not at least comprise a portion polarized parallel to the z-direction will not affect a pair of charge carriers in the photodiode 100 and accordingly will not affect any current or voltage in the diode. Accordingly the photodiode 100 comprising the polarizing grating 160 may be used for detecting light comprising a portion polarized parallel to the z-direction.

The proposed photodiode 100 accordingly comprises a photosensitive area and a polarizing grating 160 located in front of the photosensitive area, wherein the polarizing grating is formed by a plurality of galvanically conducting filaments.

The filaments of the grating 160 may be produced from a translucent material. In one embodiment, the filaments may be produced of indium tin oxide (ITO), which is a translucent and conducting material. Since ITO is translucent, it leaves light unaffected if polarized perpendicular to the direction of the filaments.

In another embodiment, the grating 160 at the same time may serve as an electrode that can be biased. As mentioned above, a biasing voltage can be used in a diode to decrease the capacitance of the diode when operating the diode with reverse bias, thus reducing the response time of the diode. The grating accordingly may comprise an interconnection 161 for galvanically coupling the filaments of the grating. Interconnection 161 may be coupled to a conductor allowing the grating 160 to be coupled to a voltage source 170 for applying a biasing voltage to the diode.

In still another embodiment, not shown in the FIGURE, the diode may further include an intrinsic layer between the p-doped and the n-doped layer. The intrinsic layer may be of a weakly doped or undoped semiconducting material. The PIN photodiode accordingly exhibits properties of a conventional PIN diode and a photodiode. The intrinsic layer affects a reduced capacitance of the junction. Also PIN photodiodes are more stable across temperature and can be produced less costly. However, PIN photodiodes are less sensitive to light than photodiodes without an intrinsic layer. In this way the photodiode may further comprise an intrinsic layer between its anode and cathode layer, thus forming a PIN photodiode.

In another embodiment, the polarizing grating 160 may be covered by another layer (not shown) of material, for example, a layer having special properties. The layer may serve as protection against mechanical impacts, which may destroy the filaments of the grating 160 or the layer may be non-reflecting, such that incident light is absorbed but not reflected by that layer. In still another embodiment the polarizing grating 160 may be embedded in any layer located in front of the photosensitive area of the diode.

The semiconductor layers of the photodiode 120/130 as described may be produced using conventional production methods followed by application of the polarizing grating 160. In one example, the polarizing grating 160 may be produced by applying the material as a continuous layer, which is subsequently patterned using conventional methods. The continuous layer may be deposited in one example by chemical vapor deposition (CVD) or electrochemical deposition (ECD) or atomic layer deposition (ALD). The layer may be patterned using conventional wet or dry etching methods, wherein, in one embodiment, conventional lithographic methods are used. In an alternative embodiment, conductive filaments may be produced within an existing layer of material by altering material properties accordingly. In one embodiment, filament shaped portions of a material layer may be changed to conducting by implanting ions into these portions, wherein the implantation process may be a high-energy implantation for injecting the ions deeply into the substrate, thus forming conducting filaments below the surface of the layer at an arbitrary depth.

Since the polarizing grating 160 in this way can be produced using conventional processing steps, for example, to produce a polarizing grating 160 from indium titanium oxide the process of forming the grating may be integrated into the semiconductor production without any micromechanical assembly.

The described photodiode may be used as discrete assembly part, for example, in a detector that distinguishes between lights of different polarizations. Alternatively, the described diode may be used as part of an integrated circuit or in a plurality of photodiodes, wherein the photodiodes may be used to detect lights of different polarizations.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:
1. An apparatus comprising:
   a photodiode comprising
   a photosensitive area; and
   a polarizing grating disposed over the photosensitive area, wherein the polarizing grating comprises a plurality of conducting filaments, wherein the filaments of the polarizing grating are coupled by an interconnection, and wherein the polarizing grating is an electrode configured to bias the photodiode.
2. The apparatus of claim 1, wherein the filaments comprise translucent material.

3. The apparatus of claim 1, wherein the filaments comprise indium tin oxide.

4. The apparatus of claim 1, wherein the photodiode comprises an anode layer adjacent a cathode layer, the anode layer having an opposite conductivity type of the cathode layer.

5. The apparatus of claim 4, further comprising an intrinsic layer between the anode layer and the cathode layer.

6. The apparatus of claim 1, wherein the photodiode comprises:
   a p+ layer having a top surface and an opposed bottom surface;
   an n+ layer adjacent the bottom surface; and
   wherein the photosensitive area comprises the top surface.

7. The apparatus of claim 1, further comprising a non-reflecting layer disposed over the polarizing grating.

8. An apparatus comprising:
   a light sensitive device comprising
      a first semiconductor layer of a first conductivity type;
      a second semiconductor layer of a second conductivity type over the first semiconductor layer, the second conductivity type opposite the first conductivity type; and
      a polarizing grating located over the second semiconductor layer, wherein the polarizing grating comprises a plurality of conducting filaments, wherein a bias voltage is applied to the first semiconductor layer, and wherein the bias voltage is applied through the polarizing grating.

9. The apparatus of claim 8, further comprising a detector coupled between the first semiconductor layer and the second semiconductor layer.

10. The apparatus of claim 9, wherein the detector comprises a current detector.

11. The apparatus of claim 9, wherein the detector comprises a voltage detector.

12. The apparatus of claim 8, further comprising an intrinsic semiconductor layer between the first semiconductor layer and the second semiconductor layer.

13. A photodiode comprising:
   a photosensitive area; and
   a polarizing grating located in front of the photosensitive area, wherein the polarizing grating comprises a plurality of galvanically conducting filaments, wherein the filaments of the polarizing grating are galvanically coupled by an interconnection, and wherein the polarizing grating is an electrode for biasing the photodiode.

14. A light sensitive device comprising:
   a first semiconductor layer of a first conductivity type;
   a second semiconductor layer of a second conductivity type over the first semiconductor layer, the second conductivity type opposite the first conductivity type; and
   a polarizing grating located over the second semiconductor layer, wherein the polarizing grating comprises a plurality of galvanically conducting filaments, wherein a bias voltage is applied to the first semiconductor layer, and wherein the bias voltage is applied through the polarizing grating.

* * * * *